(12) United States Patent
Karhade et al.

(10) Patent No.: US 9,795,038 B2
(45) Date of Patent: Oct. 17, 2017

(54) ELECTRONIC PACKAGE DESIGN THAT FACILITATES SHIPPING THE ELECTRONIC PACKAGE

(71) Applicant: Intel Corporation, Santa Clara, CA (US)

(72) Inventors: Omkar Karhade, Chandler, AZ (US); Nitin Deshpande, Chandler, AZ (US); Nachiket Raravikar, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/496,560

(22) Filed: Sep. 25, 2014

(65) Prior Publication Data

US 2016/0095220 A1    Mar. 31, 2016

(51) Int. Cl.
*H01L 23/34* (2006.01)
*H01L 23/48* (2006.01)
(Continued)

(52) U.S. Cl.
CPC .......... *H05K 3/305* (2013.01); *H01L 23/562* (2013.01); *H01L 2924/0002* (2013.01);
(Continued)

(58) Field of Classification Search
CPC ... H01L 21/67132; H01L 23/32; H01L 24/72; H01L 2924/3511; H01L 2224/16225;
(Continued)

(56) References Cited

U.S. PATENT DOCUMENTS 5,318,181 A * 6/1994 Stover ............... H05K 13/0084
                                                                206/204
6,265,772 B1 * 7/2001 Yoshida ......................... 257/712
(Continued)

FOREIGN PATENT DOCUMENTS

JP          11227871 A      8/1999
JP       2000277683 A     10/2000
(Continued)

OTHER PUBLICATIONS

"Japanese Application Serial No. 2015-159594, Office Action mailed May 10, 2016", w/ English Translation, 7 pgs.
(Continued)

*Primary Examiner* — Lex Malsawma
*Assistant Examiner* — Nduka Ojeh
(74) *Attorney, Agent, or Firm* — Schwegman Lundberg & Woessner, P.A.

(57) ABSTRACT

Some example forms relate to an electronic package. The electronic package includes an electronic component and a substrate that includes a front side and a back side. The electronic component is mounted on the front side of the substrate and conductors are mounted on the back side of the substrate. The substrate is warped due to differences in the coefficients of thermal expansion between the electronic component and the substrate. An adhesive is positioned between the conductors on the back side of the substrate and an adhesive film is attached to the adhesive positioned between the conductors on the back side of the substrate.

10 Claims, 5 Drawing Sheets

(51) Int. Cl.
*H01L 23/52* (2006.01)
*H01L 29/40* (2006.01)
*H05K 3/30* (2006.01)
*H01L 23/00* (2006.01)

(52) U.S. Cl.
CPC ............... *H01L 2924/15311* (2013.01); *H01L 2924/3511* (2013.01); *H05K 2201/10734* (2013.01); *H05K 2203/0191* (2013.01); *Y02P 70/613* (2015.11)

(58) Field of Classification Search
CPC ....... H01L 2224/32225; H01L 2924/00; H01L 2224/73204; H01L 2924/00014; H01L 2924/15311; H05K 1/181; H05K 1/0278; H05K 1/111; H05K 3/28; H05K 3/301; H05K 2201/10212
USPC .......... 257/E21.499, E21.503, E23.023, 783, 257/723; 437/118, 106, 107
See application file for complete search history.

(56) References Cited

U.S. PATENT DOCUMENTS

| | | | | |
|---|---|---|---|---|
| 6,392,143 | B1* | 5/2002 | Koshio | H01L 21/563 174/254 |
| 6,412,641 | B1* | 7/2002 | Anderson | B65D 73/02 206/460 |
| 6,924,211 | B2* | 8/2005 | Yamazaki | C09J 7/02 257/E21.505 |
| 2003/0173035 | A1* | 9/2003 | Yamaguchi | 156/580 |
| 2004/0222510 | A1* | 11/2004 | Aoyagi | H01L 23/49816 257/686 |
| 2005/0062412 | A1* | 3/2005 | Taniguchi et al. | 313/512 |
| 2010/0276799 | A1* | 11/2010 | Heng | H01L 21/50 257/704 |
| 2011/0074014 | A1* | 3/2011 | Pagaila | H01L 21/561 257/737 |
| 2012/0139110 | A1* | 6/2012 | Jan | H01L 21/67333 257/738 |
| 2014/0008819 | A1* | 1/2014 | Chan | H01L 23/49827 257/783 |
| 2014/0091474 | A1* | 4/2014 | Starkston | H01L 23/5385 257/774 |
| 2015/0164746 | A1* | 6/2015 | Costello | A61B 5/07 264/112 |

FOREIGN PATENT DOCUMENTS

| | | |
|---|---|---|
| JP | 2010212655 A | 9/2010 |
| JP | 2013163524 A | 8/2013 |

OTHER PUBLICATIONS

"Japanese Application Serial No. 2015-159594, Office Action mailed Jan. 10, 2017", w/ English Translation, 4 pgs.

"Taiwanese Application Serial No. 104127489, Response filed Dec. 8, 2016 to Office Action mailed Sep. 7, 2016", w/ English Claims, 18 pgs.

* cited by examiner

US 9,795,038 B2

ELECTRONIC PACKAGE DESIGN THAT FACILITATES SHIPPING THE ELECTRONIC PACKAGE

TECHNICAL FIELD

Embodiments described herein generally relate to electronic packages, and more particularly to electronic packages that are conveniently shipped and methods of shipping electronic packages.

BACKGROUND

Mobile products (e.g., mobile phones, smart phones, tablet computers, etc.) are typically very restricted in available space because there are often severe limitations for chip and package area and height (among other physical and electrical parameters). Therefore, it is extremely important to reduce the size of electronic components (e.g., dies) on a substrate.

However, when electronic components/packages are made relatively thin in order to accommodate this need for reduced sized electronic components, there can be difficulties that are associated with fabricating such components. As an example, thin components/packages have historically been a huge challenge for the semiconductor industry.

Some electronic components/packages include a silicon die that has a relatively low coefficient of thermal expansion (CTE) attached to a substrate that has a high CTE. Therefore, manufacturing difficulties often arise because the die is attached to the substrate which warps with temperature changes during fabrication of the components/packages. The differences in the CTE between the die and the substrate can make it extremely difficult to balance the design and material properties in a components/package in order to obtain a flat package at (i) room temperature; and (ii) bump melting temperature.

One approach to addressing manufacturing difficulties that are caused by the differences in the CTE between the die and the substrate is to include a mold material in the component/package in order to provide rigidity. Adding a mold material to the component/package suffers from several drawbacks. First, an added mold may often have non-linear material properties that result in increased stress within the component/package. Second, an added mold usually increases the overall size of the component/package (especially the Z height of the component/package). Finally, high performance components/packages usually need to remove sections of the mold in order to expose parts of the component/package from the mold. Removing parts of the mold may reduce the effectiveness of the mold relative to warpage reduction.

Another approach to addressing manufacturing difficulties that are caused by the differences in the CTE between the die and the substrate is to use metal or some other material as a stiffener. Adding a stiffener to the component/package suffers from several drawbacks. First, an added stiffener may increase the overall size of the component/package (especially the Z height of the component/package). In addition, adding a stiffener to a component/package may also limit the thermal dissipation of the component/package due to adhesive material between stiffener and silicon on the component/package.

Still another approach to addressing manufacturing difficulties that are caused by the differences in the CTE between the die and the substrate is to design the components/packages with thicker core substrates. However, making the components/packages with thicker core substrates would inherently undesirably increase the overall z-height of the components/packages with thicker core substrates.

Still another approach to addressing manufacturing difficulties that are caused by the differences in the CTE between the die and the substrate is to design the components/packages with thinner dies. However, even though thinner die architectures may provide reduced warpage to a component/package, thinner die architectures often have significantly worse transistor performance within the die.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

Some of the example electronic packages described herein utilize the flexibility of the relatively thin electronic packages in order to reduce manufacturing difficulties that are associated with fabricating electronic assemblies that include the relatively thin electronic packages. The example electronic packages described herein are shipped to other locations in a warped state instead of trying to make the electronic packages flat. Since the electronic packages are shipped in an unstressed (and warped) condition, they are relatively stress-free during shipment of the electronic packages to another location for subsequent fabrication into electronic assemblies that include the electronic packages. In addition, the electronic packages may be shipped such that there are no to minimal changes to the manufacturing processes that are utilized by the fabricators of the electronic assemblies which include the electronic packages.

Figure 1:
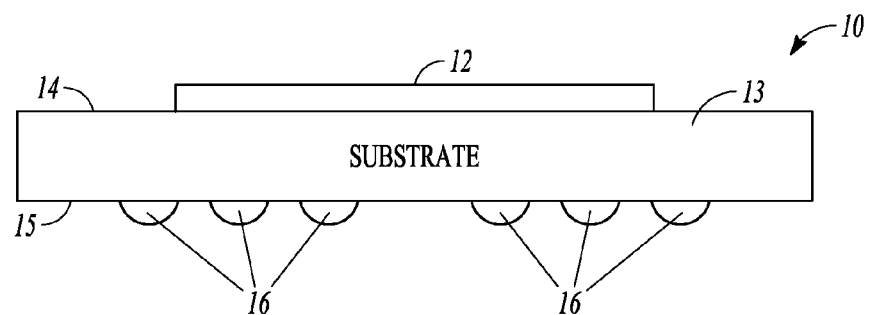
FIG. 1 illustrates an example electronic component at an elevated temperature.
Figure 2:
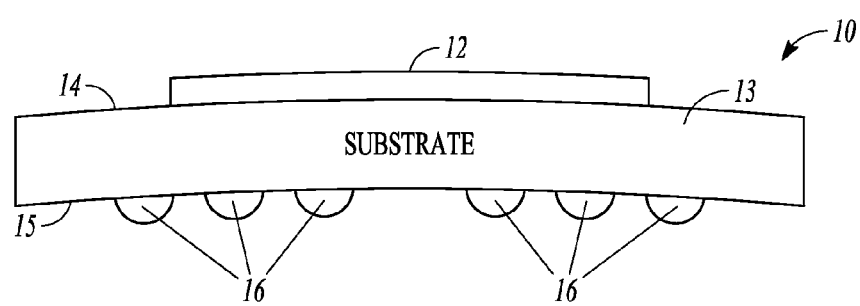
FIG. 2 illustrates the example electronic component of FIG. 1 at room temperature.

FIG. 1 illustrates an example electronic device 10 at an elevated temperature while FIG. 2 illustrates the example electronic device 10 of FIG. 1 at room temperature. As shown in FIG. 2, the electronic device 10 is in a warped condition at room temperature.

Figure 3:
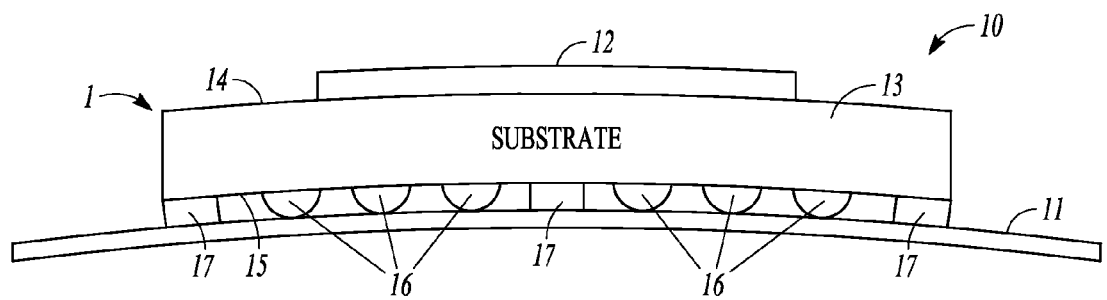
FIG. 3 illustrates the example electronic component of FIG. 2 mounted to an adhesive tape to form an electronic package.

FIG. 3 illustrates the example electronic device 10 of FIG. 2 mounted to an adhesive film 11 to form an electronic package 1. The electronic device 10 includes an electronic component 12 mounted to a substrate 13 that includes a front side 14 and a back side 15. The electronic component 12 is mounted on the front side 14 of the substrate 13 and conductors 16 are mounted on the back side 15 of the substrate 13. The substrate 13 is warped due to differences in the coefficients of thermal expansion between the electronic component 12 and the substrate 13.

An adhesive 17 is positioned between the conductors 16 on the back side 15 of the substrate 13. The adhesive film 11 is attached to the adhesive 17 that is positioned between the conductors 16 on the back side 15 of the substrate 13.

The adhesive 17 that is positioned between the conductors 16 on the back side 15 of the substrate 13 may be in the form of a plurality of pads. As an example, the plurality of pads may be positioned at each corner of the substrate 13 and in the center of the substrate 13. It be noted a variety of other forms are contemplated for the adhesive 17. Some small areas on the back side 15 of the substrate 13 may be left without conductors 16 or other components to make room for the plurality of pads.

Figure 4:
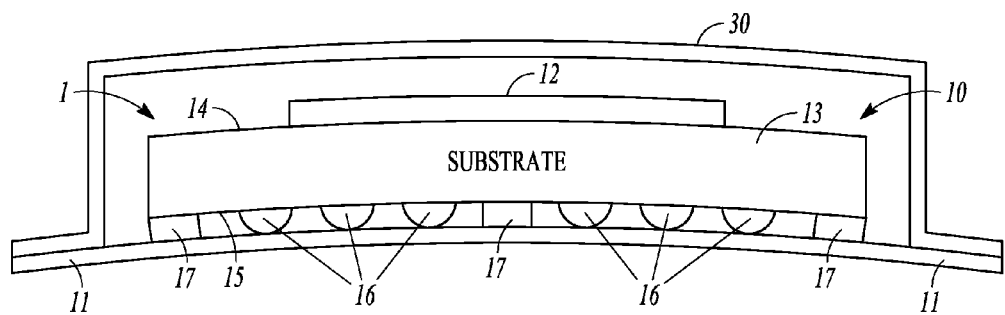
FIG. 4 illustrates the example electronic package of FIG. 3 mounted to a shipping media.

As shown in FIG. 4, the electronic package 1 may further include a shipping media 30 wherein the adhesive film 11 is secured to the shipping media 30. The shipping media 30 and/or the adhesive film 11 may include an adhesive (e.g., adhesive tape pieces) that permit the electronic package(s) 1 to be picked and placed on the shipping media 30 with force so that the electronic package(s) 1 stick to the shipping media 30. Depending on the type of adhesive that is used, thermal curing and/or UV curing may be needed to secure the shipping media 30 to the adhesive film 11.

The shipping media 30 and the adhesive film 11 may protect the electronic package 1 during shipping. It should be noted the electronic package 1 may be flat or warped when attached to the shipping media 30. The degree of flatness or warpage for the electronic package 1 will depend in part on (i) the thickness and material of the adhesive film 11; (ii) the thickness and material of the substrate 13; and/or (iii) the degree of warpage in the electronic assembly 10 at room temperature.

Figure 5:
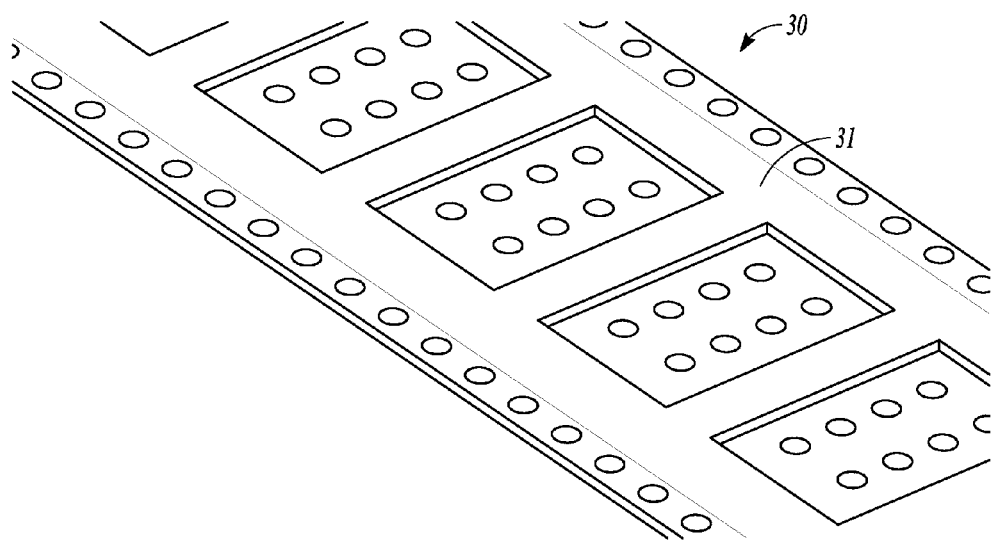
FIG. 5 illustrates a portion of an example reel that may be used as shipping media.
Figure 6:
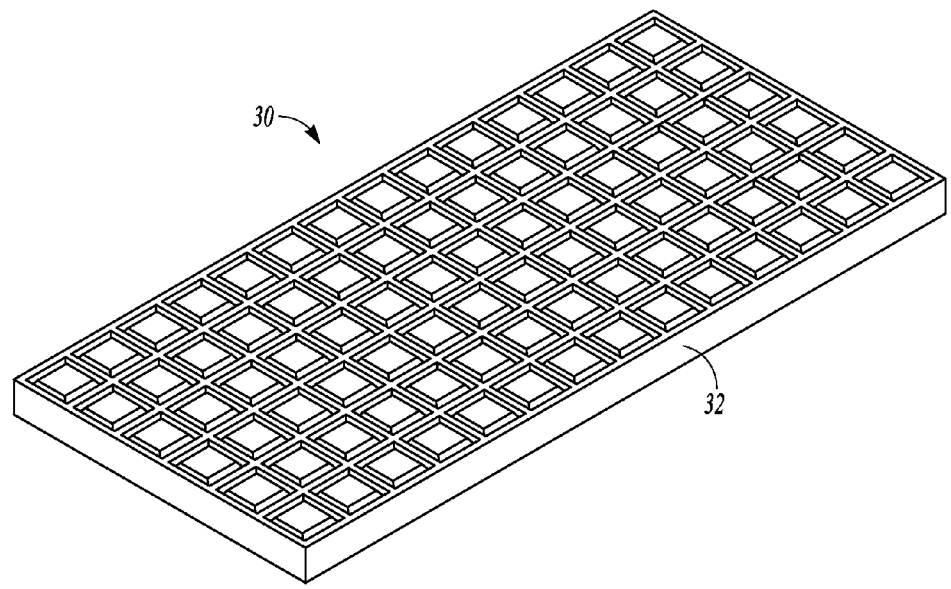
FIG. 6 illustrates a portion of an example tray that may be used as shipping media.

FIG. 5 illustrates a portion of an example tape and reel 31 that may be used as shipping media 30. FIG. 6 illustrates a portion of an example tray 32 that may be used as shipping media 30. It should be noted that other types of electronic shipping media are contemplated 1.

Figure 7:
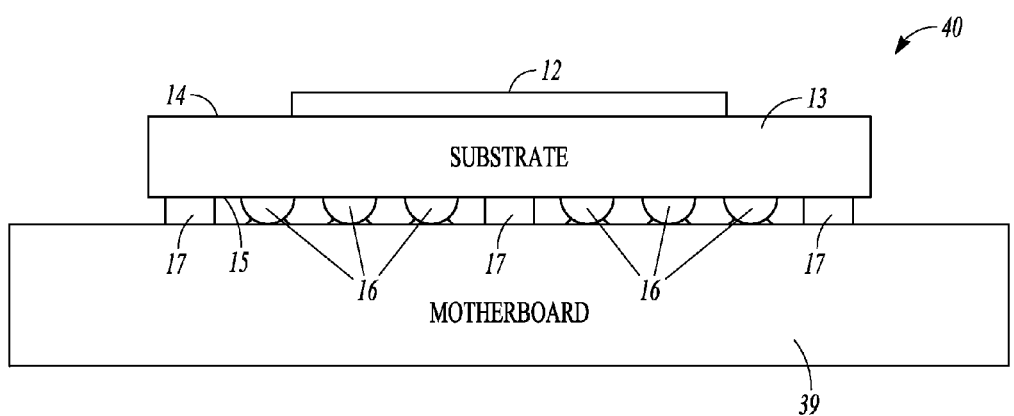
FIG. 7 illustrates the example electronic package of FIG. 4 removed from the shipping media and mounted to a motherboard to form an electronic assembly.

In some example forms of the electronic package 1, the adhesive 17 on the back side 15 of the substrate 13 may have a thickness that is similar to a desired gap that would exist once the electronic package 1 is secured to another electronic device (see, e.g., electronic assembly 40 in FIG. 7). As an example, the conductors 16 on the back side 15 of the substrate 13 may be soldered bumps that have a thickness that is similar to a desired gap that would exist once the electronic package 1 is secured to another electronic device. It should be noted that the solder bumps may be flattened such that the thickness of the flattened solder bumps approximates the desired thickness of the adhesive 17 on the back side 15 of the substrate 13.

FIG. 7 illustrates the example electronic package 1 of FIG. 4 removed from the shipping media 30 and mounted to a motherboard 39 to form an electronic assembly 40. As an example, the adhesive film 11 may be removed from the electronic package 1 to expose the adhesive 17. The electronic package 1 may then be picked up so that the electronic package 1 may be solder mounted to the motherboard 39. In some example forms, the electronic package 1 may be pressed against the motherboard 39 with mechanical force so that the electronic package 1 sticks flat to the motherboard 39.

The adhesive 17 may be a high temperature and high tacky adhesive that holds the electronic package 1 flat during solder reflow. The adhesive 17 may serve to fix the joint height of the solder to an optimum level where no undesirable bridging/openings occur within the conductors 16.

In some example forms of the electronic device 10, the electronic component 12 may be a die. It should be noted that other types of electronic components are contemplated.

As examples, the electronic components may include functional devices. Examples of functional devices include, but are not limited to, transistors, diodes, electronic circuit elements according to CMOS, Bipolar, BiCMOS, Analog/Mixed Signal, RF, Power-Semiconductor DRAM, SRAM or NVM memory technologies.

In addition, the electronic components may include passive devices. Example optional passive devices include, but are not limited to, resistors, capacitors (MOS caps, MIM caps, intermetal caps) and inductors (coils) during FEOL or BEOL processing.

It should be noted that while the electronic package 1 is shown as being in singulated form, the methods and electronic packages 1 described herein may be in wafer form, row form or any other form that promotes fabrication of the electronic packages 1. The form taken by the methods and electronic packages 1 will depend in part on manufacturing costs as well as the overall desired functionality of the electronic package 1.

In some example forms of the electronic package 1, the substrate 13 may be a silicon substrate. Other example materials for the substrate 13 include, but are not limited to, glass, silicon on isolator, silicon carbide (SiC), gallium arsenide, organic substrates and laminates, etc.

Figure 8:
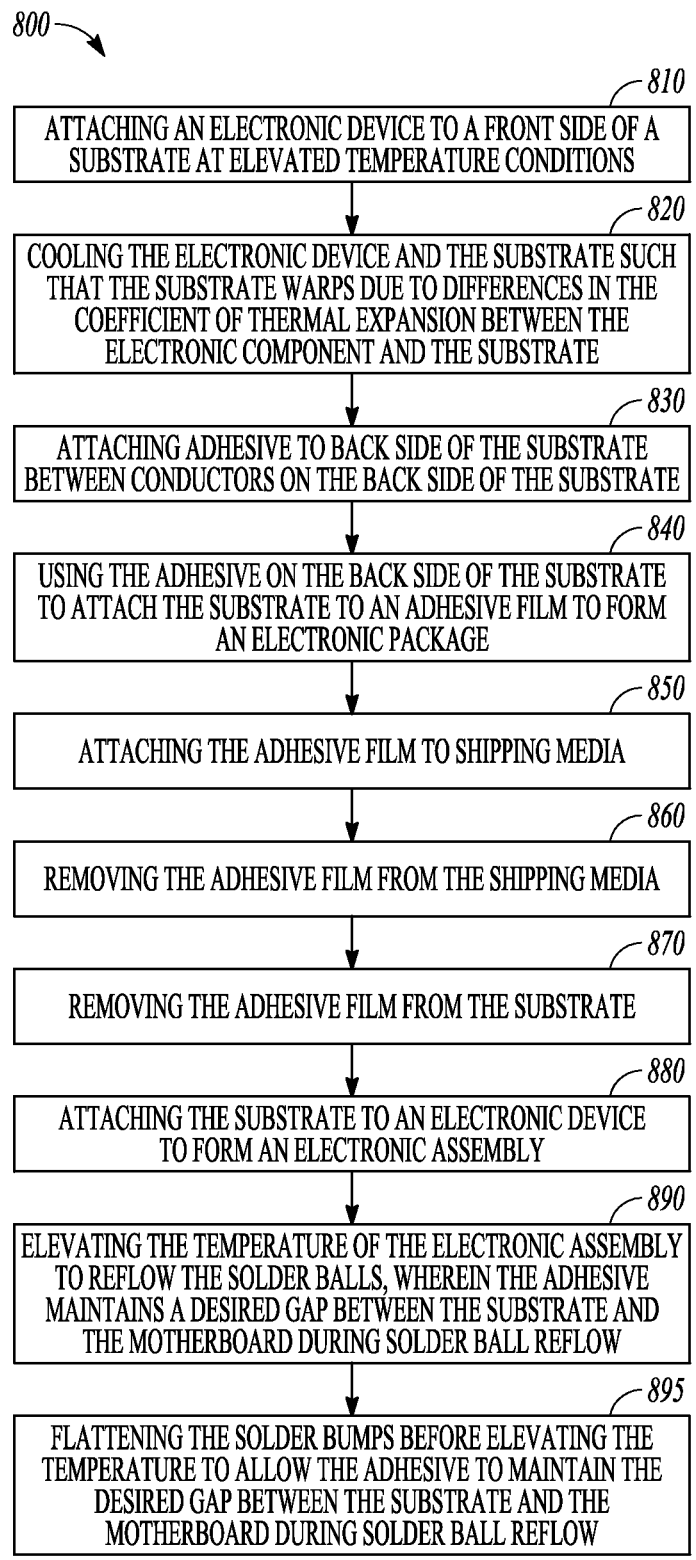
FIG. 8 is a flow diagram illustrating a method of shipping an electronic package.

FIG. 8 is a flow diagram illustrating a method [800]. The method includes [810] attaching an electronic device 10 to a front side 13 of a substrate 13 at elevated temperature conditions (see FIG. 1) and [820] cooling the electronic device 10 and the substrate 13 such that the substrate 13 warps due to differences in the coefficient of thermal expansion between the electronic device 10 and the substrate 13 (see FIG. 2).

The method [800] further includes [830] attaching adhesive 17 to a back side 15 of the substrate 13 between conductors 16 on the back side 15 of the substrate 13, and [840] using the adhesive 17 on the back side 15 of the substrate 13 to attach the substrate 13 to an adhesive film 11 to form an electronic package 1 (see FIG. 3).

In some forms of the method [800], [810] attaching an electronic device to a front side 14 of a substrate 13 at elevated temperature conditions may include attaching an electronic device 10 to a front side 14 of a substrate 13 at a temperature between approximately 150 degrees centigrade and 260 degrees centigrade. It should be noted that the appropriate temperature to attach the electronic device 10 to a front side 14 of a substrate 13 will depend in part on the method and material that is used to attach the electronic device 10 to the substrate 13.

In some forms of the method [800], [820] cooling the electronic device 10 and the substrate 13 may include cooling the electronic device 10 and the substrate 13 to room temperature. The temperature to which the electronic device 10 and the substrate 13 are cooled will depend in part on the type of materials that form the electronic device 10 and the substrate 13 as well as any substances that are used to secure the electronic device 10 to the substrate 13.

In some forms of the method [800], [840] using the adhesive 17 on the back side 15 of the substrate 13 to attach the substrate 13 to an adhesive film 11 to form an electronic package 1 may include forcing the back side 15 of the substrate 13 against the adhesive film 11. The amount of force that is applied to attach the substrate 13 to the adhesive film 11 will depend in part on the type of materials that form the adhesive 17 and the adhesive film 11.

On example material for the adhesive 17 may be high temperature sustaining double sided sticky tape (e.g., Kapton KPPTDE-⅛ double sided sticky tape) that may take up to 260 C; or 3M55256 general purpose double sided tape which may take up to 200 C for a few hours). It should be noted that any adhesive that is used in the adhesive film 11 may be formed of similar (or different) materials.

The method [800] may further include [850] attaching the adhesive film 11 to shipping media 30 (see FIG. 4). As examples, the adhesive film 11 may be attached to a reel 31 (see FIG. 5) or a tray 32 (see FIG. 6).

The method [800] may further include [860] removing the adhesive film 11 from the shipping media 30 and [870] removing the adhesive film 11 from the substrate 13. The method [800] may further include [880] attaching the substrate 13 to an electronic component (see, e.g., motherboard 39 in FIG. 7) to form an electronic assembly 40.

In some forms of the method [800], [880] attaching the substrate 13 to an electronic component 39 to form an electronic assembly 40 includes applying a force between the adhesive 17 and the electronic component 39 to adhere the substrate 13 to the electronic component. The amount of force that is applied to attach the substrate 13 to the electronic component 39 will depend in part on the type of materials that form the adhesive 17 and the electronic component.

In some forms of the method [800], the conductors 16 may be solder balls 23 such that the method [800] further includes [890] elevating the temperature of the electronic assembly 40 to reflow the solder balls 23. The adhesive 17 may maintain a desired gap between the substrate 39 and the electronic component during solder ball 23 reflow.

The method [800] may further include [895] flattening the solder bumps 23 before elevating the temperature in order to allow the adhesive 17 to maintain the desired gap between the substrate 13 and the electronic component during solder ball 23 reflow. It should be noted that the solder bumps 23 may be flattened such that the thickness of the flattened solder bumps 23 approximates the desired thickness of the adhesive 17 on the back side 15 of the substrate 13.

Figure 9:
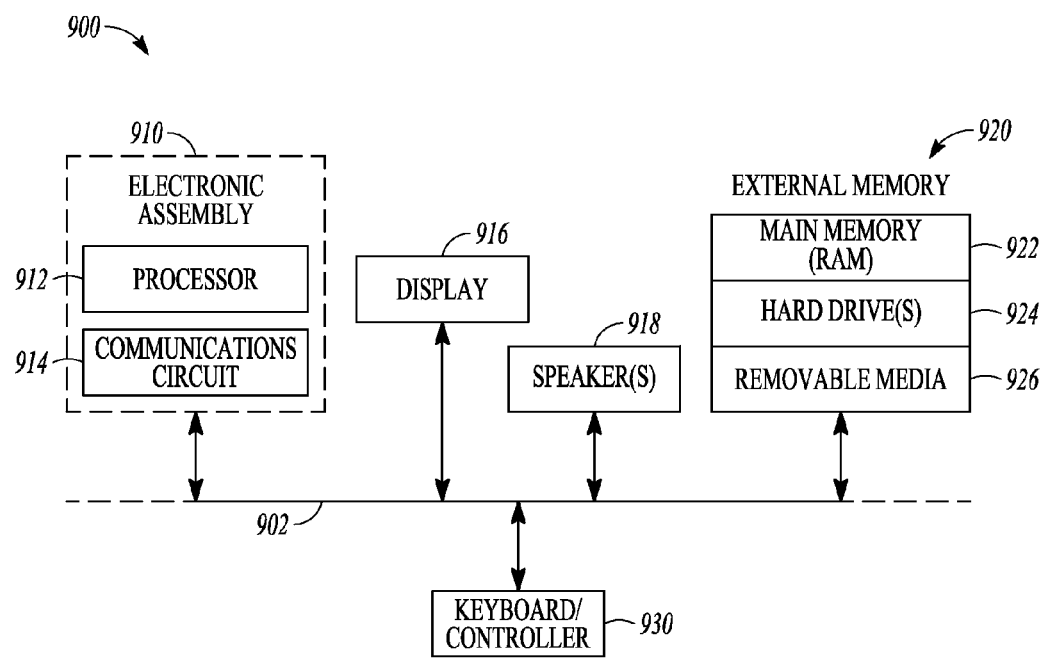
FIG. 9 is block diagram of an electronic apparatus that includes the electronic packages described herein.

FIG. 9 is a block diagram of an electronic apparatus 900 incorporating at least one electronic assembly 40, electronic package 1 and/or method [800] described herein. Electronic apparatus 900 is merely one example of an electronic apparatus in which forms of the electronic assemblies 40, electronic packages 1 and/or methods 800 described herein may be used. Examples of an electronic apparatus 900 include, but are not limited to, personal computers, tablet computers, mobile telephones, game devices, MP3 or other digital music players, etc. In this example, electronic apparatus 900 comprises a data processing system that includes a system bus 902 to couple the various components of the electronic apparatus 900. System bus 902 provides communications links among the various components of the electronic apparatus 900 and may be implemented as a single bus, as a combination of busses, or in any other suitable manner.

An electronic assembly 910 as describe herein may be coupled to system bus 902. The electronic assembly 910 may include any circuit or combination of circuits. In one embodiment, the electronic assembly 910 includes a processor 912 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that may be included in electronic assembly 910 are a custom circuit, an application-specific integrated circuit (ASIC), or the like, such as, for example, one or more circuits (such as a communications circuit 914) for use in wireless devices like mobile telephones, tablet computers, laptop computers, two-way radios, and similar electronic systems. The IC can perform any other type of function.

The electronic apparatus 900 may also include an external memory 920, which in turn may include one or more memory elements suitable to the particular application, such as a main memory 922 in the form of random access memory (RAM), one or more hard drives 924, and/or one or more drives that handle removable media 926 such as compact disks (CD), flash memory cards, digital video disk (DVD), and the like.

The electronic apparatus 900 may also include a display device 916, one or more speakers 918, and a keyboard and/or controller 930, which can include a mouse, trackball, touch screen, voice-recognition device, or any other device that permits a system user to input information into and receive information from the electronic apparatus 900.

To better illustrate the method and apparatuses disclosed herein, a non-limiting list of embodiments is provided herein:

Example 1 includes an electronic package. The electronic package includes an electronic component and a substrate that includes a front side and a back side. The electronic component is mounted on the front side of the substrate and conductors are mounted on the back side of the substrate. The substrate is warped due to differences in the coefficients of thermal expansion between the electronic component and the substrate. An adhesive is positioned between the conductors on the back side of the substrate and an adhesive film is attached to the adhesive positioned between the conductors on the back side of the substrate.

Example 2 includes the electronic package of example 1, wherein the electronic component is a die.

Example 3 includes the electronic package of any one of examples 1-2, wherein the adhesive that is positioned between the conductors on the back side of the substrate is in the form of a plurality of pads.

Example 4 includes the electronic package of any one of examples 1-3, wherein the plurality of pads are positioned at each corner of the substrate and in the center of the substrate.

Example 5 includes the electronic package of any one of examples 1-4, and further including a shipping media, wherein the adhesive film is secured to the shipping media.

Example 6 includes the electronic package of any one of examples 1-5, wherein the adhesive film includes sections that have an adhesive which is secured to the shipping media.

Example 7 includes the electronic package of any one of examples 1-6, wherein the shipping media is a reel.

Example 8 includes the electronic package of any one of examples 1-7, wherein the shipping media is a tray.

Example 9 includes the electronic package of any one of examples 1-8, wherein the adhesive on the back side of the substrate has a thickness that is similar to a desired gap that would exist once the electronic package is secured to another electronic device.

Example 10 includes the electronic package of any one of examples 1-9, wherein the conductors are soldered bumps.

Example 11 includes the electronic package of any one of examples 1-10, wherein the solder bumps are flattened such that the thickness of the flattened solder bumps approximates the thickness of the adhesive on the back side of the substrate.

Example 12 includes an electronic assembly. The electronic assembly includes an electronic component and a substrate that includes a front side and a back side. The electronic component is mounted on the front side of the substrate and conductors are mounted on the back side of the substrate. An adhesive positioned between the conductors on the back side of the substrate. An electronic device is attached to the conductors and the adhesive is positioned between the conductors on the back side of the substrate.

Example 13 includes the electronic assembly of example 12, wherein the conductors are solder bumps.

Example 14 includes the electronic assembly of any one of examples 12-13, wherein the solder bumps are flattened such that the thickness of the flattened solder bumps approximates the thickness of the adhesive on the back side of the substrate.

Example 15 includes the electronic assembly of any one of examples 12-14, wherein the electronic device is a motherboard.

Example 16 includes a method that includes attaching an electronic device to a front side of a substrate at elevated temperature conditions, cooling the electronic device and the substrate such that the substrate warps due to differences in the coefficient of thermal expansion between the electronic component and the substrate, attaching adhesive to back side of the substrate between conductors on the back side of the substrate; and using the adhesive on the back side of the substrate to attach the substrate to an adhesive film to form an electronic package.

Example 17 includes the method of example 16, attaching an electronic device to a front side of a substrate at elevated temperature conditions includes attaching an electronic component to a front side of a substrate at a temperature between approximately 150 degrees centigrade and 260 degrees centigrade.

Example 18 includes the method of any one of examples 16-17, wherein cooling the electronic device and the substrate includes cooling the electronic device and the substrate to room temperature.

Example 19 includes the method of examples 16-18, wherein using the adhesive on the back side of the substrate to attach the substrate to an adhesive film to form an electronic package includes forcing the back side of the substrate against the adhesive.

Example 20 includes the method of any one of examples 16-19, and further including attaching the adhesive film to shipping media.

Example 21 includes the method of examples 16-20, and further including removing the adhesive film from the shipping media, removing the adhesive film from the substrate, and attaching the substrate to an electronic device to form an electronic assembly.

Example 22 includes the method of any one of examples 16-21, wherein attaching the substrate to an electronic device includes attaching the substrate to a motherboard to form an electronic assembly.

Example 23 includes the method of examples 16-22, wherein attaching the substrate to a motherboard to form an electronic assembly includes applying a force between the adhesive and the motherboard to adhere the substrate to the motherboard.

Example 24 includes the method of any one of examples 16-23, wherein the conductors are solder balls and further including elevating the temperature of the electronic assembly to reflow the solder balls, wherein the adhesive maintains a desired gap between the substrate and the motherboard during solder ball reflow.

Example 25 includes the method of examples 16-24, and further including flattening the solder bumps before elevating the temperature to allow the adhesive to maintain the desired gap between the substrate and the motherboard during solder ball reflow.

This overview is intended to provide non-limiting examples of the present subject matter. It is not intended to provide an exclusive or exhaustive explanation. The detailed description is included to provide further information about the methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description.

The Abstract is provided to comply with 37 C.F.R. §1.72(b), to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. An electronic package, comprising:
   an electronic component;
   a substrate that includes a front side and a back side, the electronic component being mounted on the front side of the substrate and conductors being mounted on the back side of the substrate, the substrate being warped due to differences in the coefficients of thermal expansion between the electronic component and the substrate;
   an adhesive positioned between the conductors on the back side of the substrate, wherein the adhesive is not in direct contact with the conductors, wherein the adhesive is in the form of pads that are positioned at each corner of the substrate and the center of the substrate;
   an adhesive film detachably connected to the adhesive positioned between the conductors on the back side of the substrate, wherein the adhesive film is in direct contact with the adhesive and is removable from the adhesive, wherein the thickness of the conductors is substantially the same as the thickness of the adhesive on the back side of the substrate; and
   a shipping media, wherein the adhesive film is in direct contact with portion of the shipping media, wherein the shipping media is at least one of a reel or tray.

2. The electronic package of claim 1, wherein the electronic component is a die.

3. The electronic package of claim 1, wherein the adhesive that is positioned between the conductors on the back side of the substrate is in the form of a plurality of pads.

4. The electronic package of claim 3, wherein the plurality of pads are positioned at each corner of the substrate and in the center of the substrate.

5. The electronic package of claim 1, wherein the adhesive film includes sections that have an adhesive which is secured to the shipping media.

6. The electronic package of claim 1, wherein the conductors are soldered bumps.

7. The electronic package of claim 6, wherein the solder bumps are flattened such that the thickness of the flattened solder bumps approximates the thickness of the adhesive on the back side of the substrate.

8. An electronic package, comprising:
   an electronic component;
   a substrate that includes a front side and a back side, the electronic component being mounted on the front side of the substrate and conductors being mounted on the back side of the substrate, the substrate being warped due to differences in the coefficients of thermal expansion between the electronic component and the substrate;
   an adhesive positioned between the conductors on the back side of the substrate, wherein the adhesive is not in direct contact with the conductors, wherein the adhesive is in the form of pads that are positioned at each corner of the substrate and the center of the substrate;
   an adhesive film detachably connected to the adhesive positioned between the conductors on the back side of the substrate; wherein the adhesive film is in direct contact with the adhesive and is removable from the adhesive, wherein the adhesive film is in direct contact with the conductors; and
   a shipping media, wherein the adhesive film is in direct contact with portion of the shipping media, wherein the shipping media is at least one of a reel or tray.

9. The electronic package of claim 8, wherein the electronic component is a die.

10. The electronic package of claim 8, wherein the adhesive that is positioned between the conductors on the back side of the substrate is in the form of a plurality of pads.

* * * * *